United States Patent
Kuriyama

(10) Patent No.: US 7,038,546 B2
(45) Date of Patent: May 2, 2006

(54) HIGH-POWER AMPLIFICATION CIRCUIT FOR AMPLIFYING A HIGH FREQUENCY SIGNAL

(75) Inventor: Yasuhiko Kuriyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 10/883,705

(22) Filed: Jul. 6, 2004

(65) Prior Publication Data
US 2005/0062528 A1    Mar. 24, 2005

(30) Foreign Application Priority Data
Sep. 22, 2003   (JP)   ............................. 2003-329999

(51) Int. Cl.
*H03G 3/30* (2006.01)

(52) U.S. Cl. ..................................... 330/285; 330/133

(58) Field of Classification Search ................ 330/133, 330/285

See application file for complete search history.

(56) References Cited

U.S. PATENT DOCUMENTS

| 6,236,266 B1 | 5/2001 | Choumei et al. ............ 330/133 |
| 6,407,617 B1 | 6/2002 | Yanagihara et al. ........ 327/534 |
| 2005/0218992 A1* | 10/2005 | Birkbeck ..................... 330/296 |

FOREIGN PATENT DOCUMENTS

JP           2003-58262          2/2003

* cited by examiner

*Primary Examiner*—Steven J. Mottola
(74) *Attorney, Agent, or Firm*—Oblon, Spivak, McClelland, Maier & Neustadt, P.C.

(57) ABSTRACT

A high-power amplification circuit includes a first transistor which amplifies an input signal, a bias circuit which includes a second transistor which is an emitter follower, and supplies a bias current to a base of the first transistor, a constant-voltage power supply connected to the base of the second transistor through a first resistor, a control voltage terminal input one of a first control and a second control voltage, a third transistor including a base connected to the control voltage terminal through a second resistor, a third resistor connected between the base of the second transistor and the collector of the third transistor, and a fourth transistor connected between the base of the second transistor and the third resistor, the fourth transistor being diode-connected.

14 Claims, 3 Drawing Sheets

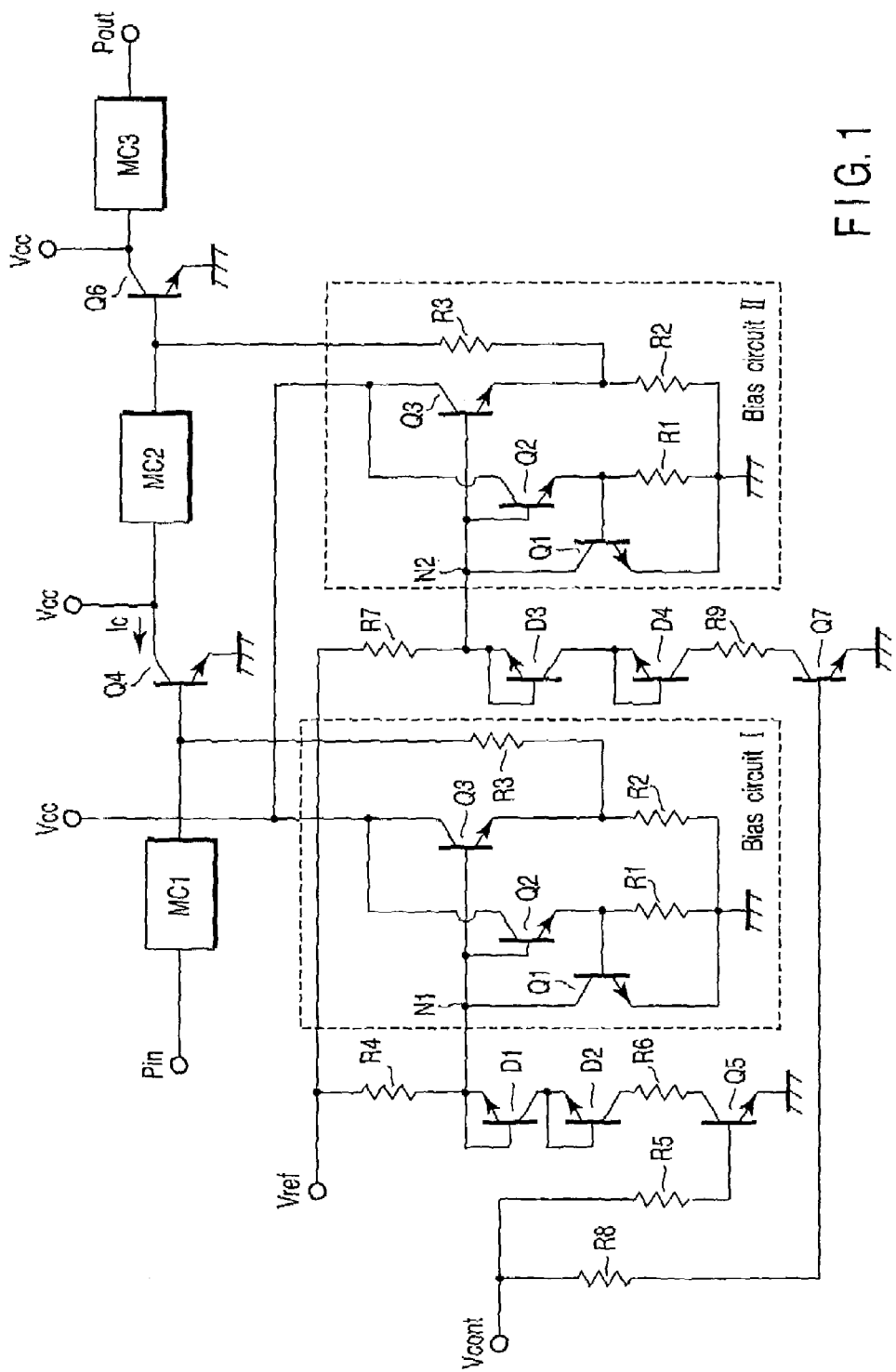
F I G. 1

| Temperature (°C) | Ic (mA) measured when V cont = 0V | Ic (mA) measured when V cont = 2V |
|---|---|---|
| -20 | 32 | 4 |
| 30 | 34 | 14 |
| 80 | 36 | 21 |

| Temperature (°C) | Ic (mA) measured when V cont = 0V | Ic (mA) measured when V cont = 2V |
|---|---|---|
| -20 | 32 | 9 |
| 30 | 34 | 15 |
| 80 | 36 | 18 |

HIGH-POWER AMPLIFICATION CIRCUIT FOR AMPLIFYING A HIGH FREQUENCY SIGNAL

CROSS-REFERENCE TO RELATED APPLICATIONS

This application is based upon and claims the benefit of priority from prior Japanese Patent Application No. 2003-329999, filed Sep. 22, 2003, the entire contents of which are incorporated herein by reference.

BACKGROUND OF THE INVENTION

1. Field of the Invention

The present invention relates to a high-power amplification circuit for amplifying a high frequency signal, more particularly, a high-power amplification circuit including a circuit for switching a bias current to be supplied to the high-power amplifier.

2. Description of the Related Art

In a high-power amplifier using a bipolar transistor, as a collector current is greatly influenced by the variation in temperature, a bias current of the high-power amplifier is supplied by, for example, a current mirror circuit in which transistors are diode-connected. On the other hand, an amplifier which is linear and highly efficient at an output level of a wide dynamic range, is implemented by setting the bias condition to the B class (a scheme of supplying the bias current until the collector current stops flowing when the input of the high-power amplifier is zero) and reducing the bias current. Actually, however, as distortion caused by variation in gain becomes great due to non-linearity of an element, linearity of gain is maintained at the output level of the wide dynamic range in a manner such as the AB class that allows the bias current to flow to some extent.

Furthermore, a high-power amplifier having a wide dynamic range and using a CDMA (Code Division Multiple Access) system, which is adopted by, e.g., a mobile telephone, uses a low control voltage. Therefore, a high-power amplification circuit is therefore required to highly efficiently operate in its outputting operation. Thus, in order to achieve such a highly efficient operation, the high-power amplifier is operated with a bias current having a small value, such that a power of an output signal is reduced.

FIG. 5 shows an example of a bias circuit employing an emitter follower. In this circuit, a power supply voltage Vcc is applied to a collector of a transistor Q10. Also, a reference voltage Vref is applied to a base of the transistor Q10 through a resistor R10. An emitter of the transistor Q10 is grounded through a resistor R11. In addition, diode-connected transistors Q8 and Q9 are connected in series between the base of the transistor Q10 and the ground.

In a high-power amplification circuit using such a bias circuit, however, the transistors are stacked at two stages. Thus, it is impossible to sufficiently compensate for the variation in the bias current to the influence of the variation in temperature unless the reference voltage Vref is increased to be much higher than the double of an ON-state voltage of the transistors. On the other hand, the increase in the reference voltage Vref is a serious problem in a system such as a cellular phone having a low control voltage. Especially, when the high-power amplification circuit is operated with a bias current having a small value, such that the power of the output signal is reduced, the variation of the bias current which is caused by the temperature change is a problem for the high-power amplification circuit.

Various types of bias circuits for stabilizing the amount of a bias to be applied are known as a related technique (see Jpn. Pat. Appln. KOKAI Publication No. 2003-58262).

BRIEF SUMMARY OF THE INVENTION

The high-power amplification circuit according to a first aspect of the present invention comprises: a first transistor configured to amplify an input signal; a bias circuit including a second transistor which is an emitter follower, and configured to supply a bias current to a base of the first transistor; a constant-voltage power supply connected to a base of the second transistor through a first resistor; a control voltage terminal to which one of a first control and a second control voltage is to be input to switch a value of the bias current between two current values; a third transistor including a base connected to the control voltage terminal through a second resistor; a third resistor connected between the base of the second transistor and a collector of the third transistor; and a fourth transistor connected between the base of the second transistor and the third resistor, the fourth transistor being diode-connected.

The high-power amplification circuit according to a second aspect of the present invention comprises: a first transistor configured to amplify an input signal; a bias circuit including a second transistor which is an emitter follower, and configured to supply a bias current to a base of the second transistor; a constant-voltage power supply connected to a base of the second transistor through a first resistor; a control voltage terminal to which one of a first control and a second control voltage is to be input to switch a value of the bias current between two current values; a third transistor including a base connected to the control voltage terminal through a second resistor; a third resistor connected between the base of the second transistor and a collector of the third transistor; and a first diode connected between the base of the second transistor and the third resistor, and including an anode connected to the base of the second transistor.

BRIEF DESCRIPTION OF THE SEVERAL VIEWS OF THE DRAWING

FIG. 1 is a view showing the circuit structure of the high-power amplification circuit according to the first embodiment of the present invention.

DETAILED DESCRIPTION OF THE INVENTION

Figures 2, 3, 5:
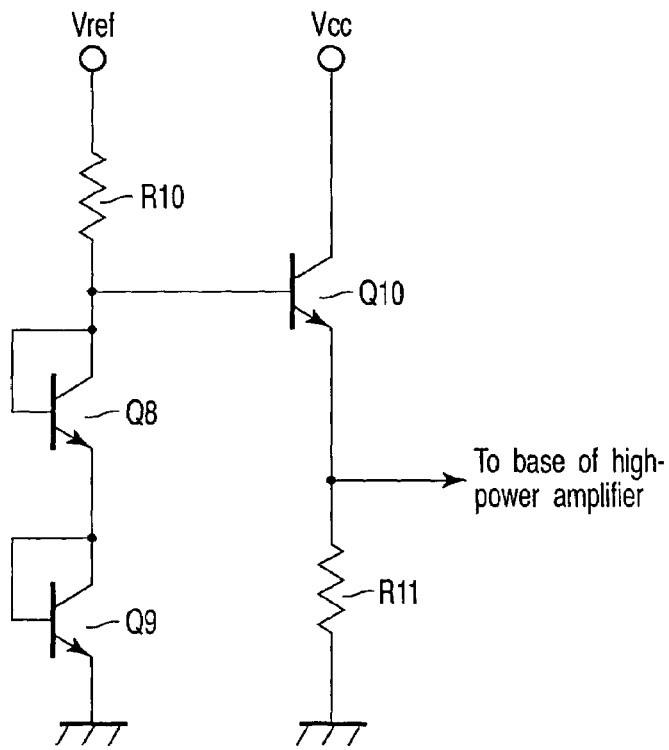
FIG. 2 is a view showing a relationship between the temperature and the collector current in the high-power amplification circuit in FIG. 1, which is established in the case where the diodes D1 and D2 in the high-power amplification circuit are not connected.
FIG. 3 is a view showing a relationship between the temperature and the collector current in the high-power amplification circuit in FIG. 1.
FIG. 5 is a view showing one example of a bias circuit employing an emitter follower.

The present invention has been made in view of the above circumstances, and will be explained with reference to the accompanying drawings. In the following description, structural elements having the same functions and same structures will be denoted by the same reference numerals. After they are each explained one time, their explanations will not be repeated, except as need arises.

THE FIRST EMBODIMENT

FIG. 1 is a view showing the circuit structure of the high-power amplification circuit according to the first embodiment of the present invention.

The high-power amplification circuit according to the first embodiment amplifies a signal input from an input terminal Pin by using transistors Q4 and Q6. That is, the input signal is amplified at two stages. The input terminal Pin is connected to an input matching circuit MC1. The input matching circuit MC1 is connected to the base of the transistor Q4, which serves as a high-power amplifier, and carries out impedance matching between the output impedance of a circuit (not shown) for outputting an input signal to be input to the high-power amplification circuit and the input impedance of the transistor Q4.

To a collector of the transistor Q4, a power supply voltage Vcc is applied. To an emitter of the transistor Q4, a ground potential is applied. The collector of the transistor Q4 is connected to a matching circuit MC2. The matching circuit MC2 is connected to a base of a transistor Q6, which serves as a high-power amplifier. Also, the matching circuit MC2 performs impedance matching between the output impedance of the transistor Q4 and the input impedance of the transistor Q6.

To a collector of the transistor Q6, the power supply voltage Vcc is applied. To an emitter of the transistor Q6, the ground potential is applied. The collector of the transistor Q6 is connected to an output matching circuit MC3. The output matching circuit MC3 performs impedance matching between the input impedance of a circuit (not shown) which receives, as an input, a signal output from an output terminal Pout and the output impedance of the transistor Q6.

The bases of the transistors Q4 and Q6 are supplied with a bias current. The transistor Q4 is supplied with the bias current from a bias circuit I including a transistor Q3, which comprises a grounded-collector circuit (emitter follower). To a collector of the transistor Q3, the power supply voltage Vcc is applied. A base of the transistor Q3 is connected to a node N1.

A temperature compensating circuit for the transistor Q3 comprises transistors Q1 and Q2 and a resistor R1. A base of the transistor Q2 is connected to the node N1. To a collector of the transistor Q2, the power supply voltage Vcc is applied. A collector of the transistor Q2 is connected to a base of the transistor Q1. To an emitter of the transistor Q2 through the resistor R1, the ground potential is applied.

Also, the base of the transistor Q2 is connected to a collector of the transistor Q1. A base of the transistor Q1 is connected to the emitter of the transistor Q2. To an emitter of the transistor Q1, the ground potential is applied. The bias circuit I is formed to have the above structure. However, the structure of the bias circuit I is not limited to the above structure. That is, the structure is one example of the structure of the bias circuit I. It may be modified.

A bias circuit II for supplying a bias current to the transistor Q6 has the same structure as the bias circuit I, and its explanation will thus be omitted.

A bias current switching circuit 1 is connected to the node N1, and has the following structure:

One of the terminals of a resistor R4 is connected to the node N1, and to the other, a reference voltage Vref is applied. The reference voltage Vref is determined in accordance with a base-emitter voltage, etc., i.e., characteristics of a transistor.

A diode D1 is connected to said one of the terminals of the resistor R4. The diode D1 comprises a PN junction diode in which a base and an emitter of a transistor are connected to each other (diode-connection). Also, a anode of the diode D1 (the emitter of the transistor) is connected to said one of the terminals of the resistor R4. A diode D2 is connected to the diode D1 in series, and is the same as the diode D1 in structure and direction.

One of the terminals of the resistor R6 is connected to the diode D2, and the other is connected to a collector of the transistor Q5. To a base of the transistor Q5, a control voltage Vcont is applied through a resistor R5. To an emitter of the transistor Q5, the ground potential is applied. The transistor Q5 functions as a switch. The control voltage Vcont is applied from the outside of the high-power amplification circuit, and is intended to switch the value of the bias current to be output from the bias circuit I or II. Also, the applied control voltage Vcont has two voltage values (for example, 0V and 2 V). The bias current switching circuit 1 is thus composed.

Furthermore, a bias current switching circuit 2 is connected to a node N2 of the bias circuit II. The bias current switching circuit 2 comprises diodes D3 and D4, resistors R7, R8 and R9, and a transistor Q7. It is the same as the bias current switching circuit 1 in connection and function, and its explanations will thus be omitted.

Next, a structure of each of the elements will be explained. In the first embodiment, each of the transistors is an InGaP/GaAs HBT (Hetero-junction Bipolar Transistor) which comprises an emitter formed of InGaP, a base and a collector, both formed of GaAs. The transistors Q4 and Q5 each have a multi-emitter structure in which forty-eight emitters are provided, and each have a size of 4×30 μm².

In the bias circuits I and II, each of the transistors Q1 and Q2 has a multi-emitter structure which includes six emitters each having a size of 4×10 μm², and the transistor Q3 also has a multi-emitter structure which includes six emitters each having a size of 4×20 μm². The resistors R1 and R2 each has a value of 3 kΩ.

In the bias current switching circuits 1 and 2, the transistors Q5 and Q7 have emitters each having a size of 4×10 μm². The resistors R4 and R7 each have a value of 600 Ω. The resistors R5 and R8 each have a value of 20 kΩ. The resistors R6 and R9 each have a value of 12 kΩ. Each of these values is one example. That is, the sizes of those transistors and the values of those resistors are not limited to the above values.

The elements of the high-power amplification circuit are provided in an MMIC (Monolithic Microwave Integrated Circuit) wherein its elements are formed on the same semiconductor substrate.

The operation of the above high-power amplification circuit will be explained.

When the control voltage Vcont is 0V, no voltage is applied to the base of the transistor Q5 serving as a switch. Thus, the transistor Q5 is in the OFF state. Thereby, a current based on the reference voltage Vref flows to the node N1 through the resistor R4. Thus, a base current having a great value flows to the transistor Q3. The transistor Q3 supplies a bias current, which is determined in value in accordance with the base current, to the transistor Q4.

On the other hand, when the control voltage Vcont is 2V (i.e., the output power is low), the voltage is applied to the base of the transistor Q5. Thus, the transistor Q5 is in the ON state. Thereby, a current flows from the node N1 to the resistor R6 through the diodes D1 and D2. Therefore, to the transistor Q3, a base current flows which has a small value, as compared with the case where the control voltage Vcont is 0V. In such a manner, the value of the bias current to be supplied to the transistor Q4 can be switched between two current values.

In the first embodiment, transistors having the same structure as, e.g., the transistor Q3, are used as the diodes D1 and D2. Furthermore, they are diode-connected transistors in each of which the base and emitter are connected together. Also, in the InGap/GaAs HBT used in the first embodiment, for example, the base-collector junction voltage is 1.0V, and the base-emitter junction voltage is 1.2V. The transistors Q3 and Q4 are stacked at two stages between the power supply voltage Vcc to the node N1. Thus, a voltage of 2.4V, which is double the base-emitter junction voltage, is applied to the node N1.

The two diodes D1 and D2 can be turned on, when a voltage of 2.0V, which is double as the base-collector junction voltage, is applied to the diodes D1 and D2. Thus, the two diodes D1 and D2 can be connected between the node N1 and the resistor R6. The two diodes D1 and D2 have the function of a level shift. Therefore they can restrict the voltage variation of the bias current switching circuit 1 when the output power is low, and can thus compensate for the variation of the bias current, which is caused by the temperature change. In addition, since the two diodes D1 and D2 are connected, they can more effectively achieve the above compensation. The same is true of the bias circuit II.

FIG. 2 shows measured values in the case where in the high-power amplification circuit in FIG. 1, the diodes D1 and D2 are not connected. FIG. 3 shows measured values obtained in the high-power amplification circuit in FIG. 1 (wherein the diodes D1 and D2 are connected). To be more specific, FIGS. 2 and 3 show values of collector current Ic which are actually respectively measured at three temperatures of −20° C., 30° C. and 80° C., when the control current Vcont is 0V, and also when it is 2V. The collector current Ic is a collector current in the transistor Q4. Also, the above measurement is carried out, with the reference voltage Vref set at 2.8V.

As is clear from FIGS. 2 and 3, when the control voltage Vcont is 0V, the collector current Ic in the high-power amplifier (the transistor Q4) in FIG. 1 has the same value as that in the case where the diodes D1 and D2 are not connected. On the other hand, when the control voltage Vcont is 2V, i.e., the output power is low, the variation of the collector current Ic of the high-power amplifier in FIG. 1 is smaller than that in the case where the diodes D1 and D2 are not connected.

As explained in detail above, in the first embodiment, the high-power amplification circuit including a circuit for switching the value of the base current of the transistor Q3 in the bias circuit I has the resistor Q6, which serves to pull down the above base current. Then, the two diodes D1 and D2 are connected in series between the bias circuit I and the resistor R6. The diodes D1 and D2 are formed of transistors having the same structure as the transistor Q3, and each including a base and an emitter which are connected together (diode-connection).

By virtue of the above structure, according to the first embodiment, the value of the bias current to be supplied to the high-power amplifier can be switched between two values. Thereby, the output power for operating the high-power amplifier (i.e., the transistors Q4 and Q6) can be decreased.

Furthermore, the high-power amplification circuit includes the diodes D1 and D2, it can compensate for the variation of the bias current, which is caused by the temperature change. Thereby, a bias current the variation of which is small for the temperature change can be supplied. Also, when the output power is low in the high-power amplifier, a bias current the variation of which is small for the temperature change can be applied.

Moreover, the two diodes which are formed of the HBT are connected by utilizing the difference between the base-emitter voltage and the base-collector voltage. Thereby, a bias current can be supplied the variation of which is small, as compared with the case where only one diode is provided.

Also, in the first embodiment, the high-power amplification circuit is provided in an MMIC. The diodes D1 and D2 are formed of transistors as mentioned above. Therefore, the above transistors and the diodes D1 and D2 can be formed in the same process, thus lowering the manufacturing cost.

Furthermore, only one of the two diodes D1 and D2 may be formed of a diode-connected transistor in which the base and the collector are connected to each other. Further, the number of diodes provided may be one. If only one diode is provided, it may be a diode-connected transistor in which the base and the collector are connected or that in which the base and the emitter are connected.

In the high-power amplification circuit according to the first embodiment, the input signal input from the input terminal Pin is amplified by two stages, i.e., the transistors Q4 and Q8. However, it may be amplified by the transistor Q4 only.

In addition, in the first embodiment, as repeatedly mentioned above, the diode-connected transistors are used as the diodes D1 and D2. However, the diodes D1 and D2 may be ordinary diodes which are not formed of the transistor. Also, as long as the PN junction of each of the above diodes is the same structure as that of the base and emitter of the transistor Q3 or Q4, the same advantage can be obtained as in the case where the diode-connected transistors are used as stated above.

THE SECOND EMBODIMENT

A high-power amplification circuit according to the second embodiment is formed by replacing the diode-connected transistors in the first embodiment by Schottky diodes.

Figure 4:
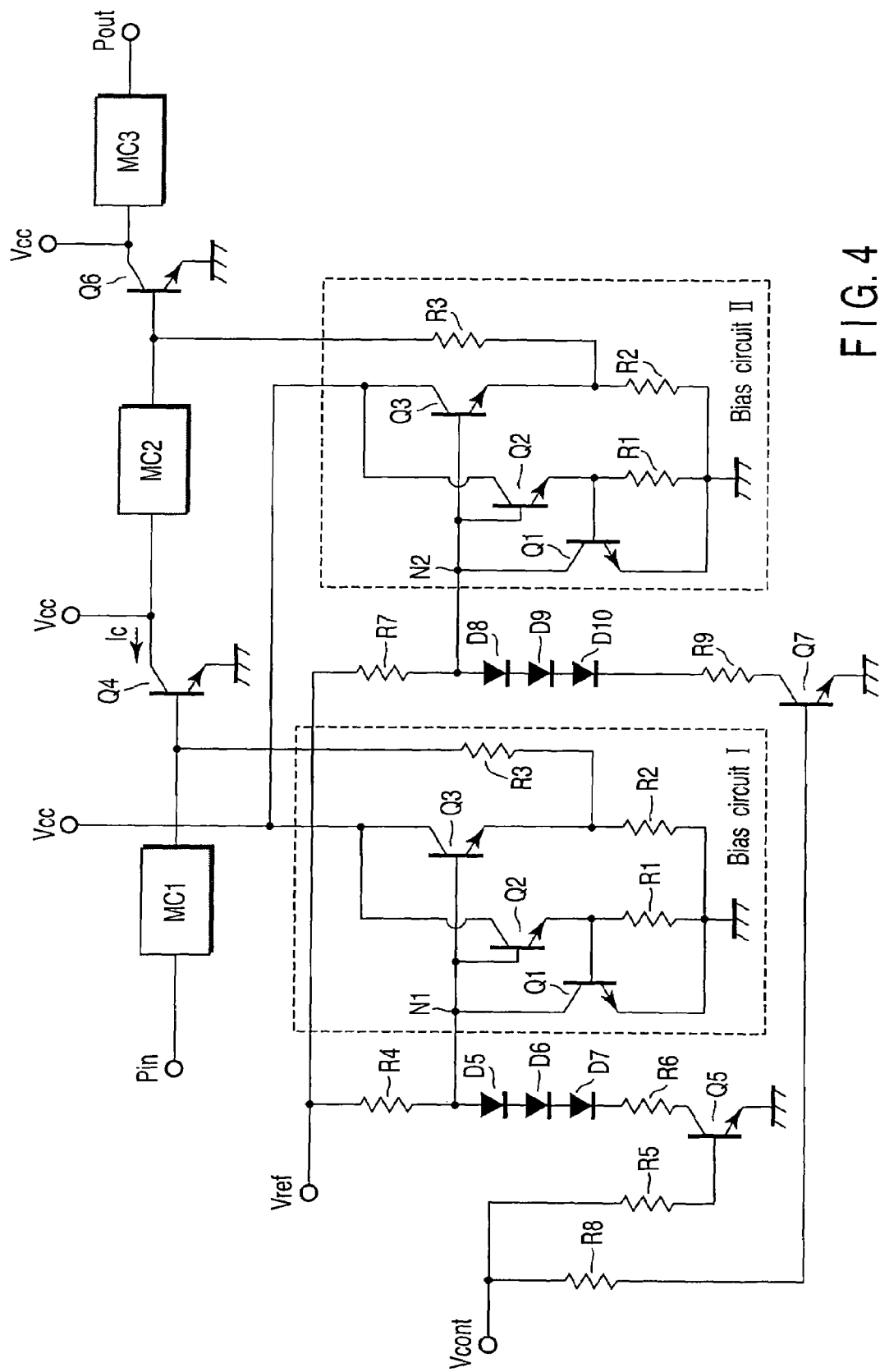
FIG. 4 is a view showing the circuit structure of the high-power amplification circuit according to the second embodiment of the present invention.

FIG. 4 is a view showing the circuit structure of the high-power amplification circuit according to the second embodiment of the present invention, which will be explained as follows.

In the second embodiment, a bias current switching circuit 1 is connected to the node N1. A Schottky diode D5 is connected to one of the terminals of the resistor R4 (to the other, the reference voltage Vref is applied). The Schottky diode D5 comprises a metal electrode and a semiconductor layer which is formed of the same material as the collector layers of the transistors used in the first embodiment. The metal electrode is formed of, e.g., Ti/Pt/Au. An anode of the Schottky diode D5 is connected to said one of the terminals of the resistor R4.

Schottky diodes D6 and D7 are connected in series to the Schottky diode D5, and are the same as the Schottky diode D5 in structure and direction. The Schottky diode D7 is connected to one of the terminals of the resistor R6.

Similarly, to the node N2 of the bias current II, a bias current switching circuit 2 is connected. The bias current switching circuit 2 includes Schottky diodes D8, D9 and D10, the resistors R7, R8 and R9, and the transistor Q7.

These Schottky diodes are the same as those of the above bias current switching circuit 1 in connection and structure, and their explanations will thus be omitted.

The operation of the high-power amplification circuit having such a structure will be explained.

When the control voltage Vcont is 2V (i.e., the output power is low), the voltage is applied to the base of the transistor Q5. Thus, the transistor Q5 is in the ON state. Thereby, a current flows from the node N1 to the resistor R6 through the Schottky diodes D5, D6 and D7. Thus, to the transistor Q3, a base current flows which has a small value, as compared with the case where the control voltage Vcont is 0V. In such a manner, the value of the bias current to be supplied to the transistor Q4 can be switched between two values.

The diodes used in the second embodiment, as stated above, are Schottky diodes. The ON voltage of the Schottky diode is low. To be more specific, the ON voltage of each of the three Schottky diodes D5, D6 and D7 is, e.g., 0.5V. Thus, the voltage drop of the three Schottky diodes D5, D6 and D7 is 1.5V. Accordingly, the three diodes D5, D6 and D7 can be connected between the node N1 and the resistor R6. The Schottky diodes D5, D6 and D6 have the function of a level shift. Thus, they can restrict the voltage variation of the bias current switching circuit 1 when the output power is low, and can thus compensate for the variation of the bias current, which is caused by the temperature change. The same is true of the Schottky diodes D8, D9 and D10 of the bias current switching circuit 2.

The advantage obtained by the above compensation will be explained by referring to actually measured values.

When the control voltage Vcont is 0V, measured values are the same as those in the first embodiment. On the other hand, when the control voltage Vcont is 2V, the values of the collector current Ic in the transistor Q4 which are measured at temperatures of −20° C., 30° C. and 80° C. are 12 mA, 15 mA and 16 mA, respectively.

When the control voltage Vcont is 2V, i.e., the output power is low, the variation of the collector current Ic of the high-power amplifier in FIG. 4 is small, as compared with the case where the Schottky diodes D5, D6 and D7 are not connected. Also, the variation of the collector current Ic is small than that in the first embodiment.

As explained in detail above, according to the second embodiment, the value of the bias current to be supplied to the high-power amplifier can be switched between two values. Accordingly, the high-power amplification circuit can be operated such that the output power is low.

Furthermore, since the high-power amplification circuit includes the Schottky diodes D5, D6 and D7, it can compensate for the variation of the bias current, which is caused by the temperature change. Thereby, a bias current can be supplied the variation of which is small for the temperature change. Also, when the output power is low in the high-power amplification circuit, a bias current can be supplied the variation of which is small for the temperature change.

The Schottky diodes are each formed of a semiconductor layer formed as the same material of the collector layers of the transistors. Thus, the above compensation can be effectively carried out. In addition, the Schottky diodes can be formed on the same substrate as the transistors, as a result of which the manufacturing cost can be reduced, and the circuit area can be reduced.

The number of Schottky diodes to be connected in series between the node N1 and the resistor R6 may be four. If it is four, the voltage drop of the four Schottky diodes is 2V.

That is, the four Schottky diodes can be connected between the node N1 and the resistor R6.

The advantage obtained by using the four Schottky diodes will be explained by referring to actually measured values.

When the control voltage Vcont is 0V, the collector current Ic of the transistor Q4 has the same value as that in the first embodiment. On the other hand, when the control voltage Vcont is 2V, the values of the collector current Ic in the transistor Q4 which are measured at temperatures of −20° C., 30° C. and 80° C. are 14 mA, 15 mA and 16 mA, respectively.

When the control voltage Vcont is 2V, i.e., the output power is low, the variation of the collector current Ic of the high-power amplifier is smaller than that in the case where the Schottky diodes are not connected. Also, the variation of the collector current Ic is further smaller than that in the case where the three Schottky diodes are used as stated above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-power amplification circuit comprising:
a first transistor configured to amplify an input signal;
a bias circuit including a second transistor which is an emitter follower, and configured to supply a bias current to a base of the first transistor;
a constant-voltage power supply connected to a base of the second transistor through a first resistor;
a control voltage terminal to which one of a first control and a second control voltage is to be input to switch a value of the bias current between two current values;
a third transistor including a base connected to the control voltage terminal through a second resistor;
a third resistor connected between the base of the second transistor and a collector of the third transistor; and
a fourth transistor connected between the base of the second transistor and the third resistor, the fourth transistor being diode-connected.

2. The high-power amplification circuit according to claim 1, which further comprises a fifth transistor connected between the fourth transistor and the third resistor, the fifth transistor being diode-connected, and wherein a base and an emitter of at least one of the fourth transistor and the fifth transistor are connected.

3. The high-power amplification circuit according to claim 2, wherein each of the first to fifth transistors comprises a Hetero-junction Bipolar Transistor and has the same structure.

4. The high-power amplification circuit according to claim 3, wherein each of the first to fifth transistors includes an emitter formed of InGaP, and a base and a collector, both formed of GaAs.

5. The high-power amplification circuit according to claim 1, wherein the first transistor amplifies a high frequency signal.

6. A high-power amplification circuit comprising:
a first transistor configured to amplify an input signal;
a bias circuit including a second transistor which is an emitter follower, and configured to supply a bias current to a base of the first transistor;
a constant-voltage power supply connected to a base of the second transistor through a first resistor;

a control voltage terminal to which one of a first control and a second control voltage is to be input to switch a value of the bias current between two current values;

a third transistor including a base connected to the control voltage terminal through a second resistor;

a third resistor connected between the base of the second transistor and a collector of the third transistor; and a first diode connected between the base of the second transistor and the third resistor, and including an anode connected to the base of the second transistor.

7. The high-power amplification circuit according to claim 6, which further comprises a second diode connected between the first diode and the third resistor, and including an anode connected to the first diode.

8. The high-power amplification circuit according to claim 7, wherein each of the first and second transistors comprise a Hetero-junction Bipolar Transistor having the same structure, and each of the first and second diodes is a PN junction diode having a structure which is the same as a structure in which a base and a collector of the first transistor are employed.

9. The high-power amplification circuit according to claim 8, wherein each of the first to third transistors includes an emitter formed of InGaP, and a base and a collector, both formed of GaAs.

10. The high-power amplification circuit according to claim 6, wherein the first diode is a Schottky diode.

11. The high-power amplification circuit according to claim 10, which further comprises three or less second Schottky diodes connected in series between the first diode and the third resistor, and also connected in the same direction as the first diode.

12. The high-power amplification circuit according to claim 10, wherein each of the first to third transistors includes an emitter formed of InGaP, and a base and a collector, both formed of GaAs, and the Schottky diode includes a semiconductor formed of the same material as the collector of said each transistor.

13. The high-power amplification circuit according to claim 11, wherein each of the first to third transistors includes an emitter formed of InGaP, and a base and a collector, both formed of GaAs, and each of the Schottky diodes includes a semiconductor formed of the same material as the collector of said each transistor.

14. The high-power amplification circuit according to claim 6, wherein the first transistor amplifies a high frequency signal.

* * * * *